(12) United States Patent
Zimlich

(10) Patent No.: US 6,538,494 B2
(45) Date of Patent: Mar. 25, 2003

(54) PUMP CIRCUITS USING FLYBACK EFFECT FROM INTEGRATED INDUCTANCE

(75) Inventor: David A. Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/805,207

(22) Filed: Mar. 14, 2001

(65) Prior Publication Data

US 2002/0130699 A1 Sep. 19, 2002

(51) Int. Cl.[7] .................................................. G05F 1/10
(52) U.S. Cl. ........................................ 327/537; 327/536
(58) Field of Search ................................ 327/530, 536, 327/535, 537, 109; 333/185, 175, 184

(56) References Cited

U.S. PATENT DOCUMENTS

| | | | |
|---|---|---|---|
| 5,126,590 A | 6/1992 | Chern | 327/536 |
| 5,267,218 A | * 11/1993 | Elbert | 365/226 |
| 5,367,489 A | 11/1994 | Park et al. | 365/189.11 |
| 5,721,509 A | * 2/1998 | Taft et al. | 327/536 |
| 5,939,866 A | * 8/1999 | Biorkengen | 323/266 |
| 6,011,743 A | 1/2000 | Khang | 365/226 |
| 6,091,613 A | 7/2000 | Yang et al. | 363/60 |
| 6,160,440 A | 12/2000 | Javanifard et al. | 327/536 |
| 6,160,749 A | 12/2000 | Pinkham et al. | 365/226 |

FOREIGN PATENT DOCUMENTS

JP          406045148    *  2/1994

OTHER PUBLICATIONS

Arcioni et al., "Design and Characterization of Si Integrated Inductors", IEEE Instumentation and Measurement Technology Conference, 5/98.
Chap. 1, An Introduction to DRAM, Sec. 1.2 DRAM Basics, pp. 24–29.
28V, Low–Power, High Voltage, Boost or Inverting DC–DC Converter.
Chap. 6, Voltage Converters, Sec. 6.2 Pumps and Generators, pp. 166–171.
Brent Keeth, "A DRAM Circuit Design Tutorial", Micron Technology, Inc., 12/95, pp. 75–79.

* cited by examiner

*Primary Examiner*—Dinh T. Le
(74) *Attorney, Agent, or Firm*—Dickstein Shapiro Morin & Oshinsky LLP

(57) ABSTRACT

A high speed semiconductor device, such as a high speed dynamic random access memory (DRAM) includes an on-chip charge pump. The charge pump is based upon the flyback effect of an inductor, thereby permitting the charge pump to be switched at a frequency compatible with high performance semiconductor devices. The inductor of the charge pump comprises a plurality of serially connected metal spirals and is integrated into the semiconductor device.

20 Claims, 7 Drawing Sheets

PRIOR ART

PRIOR ART

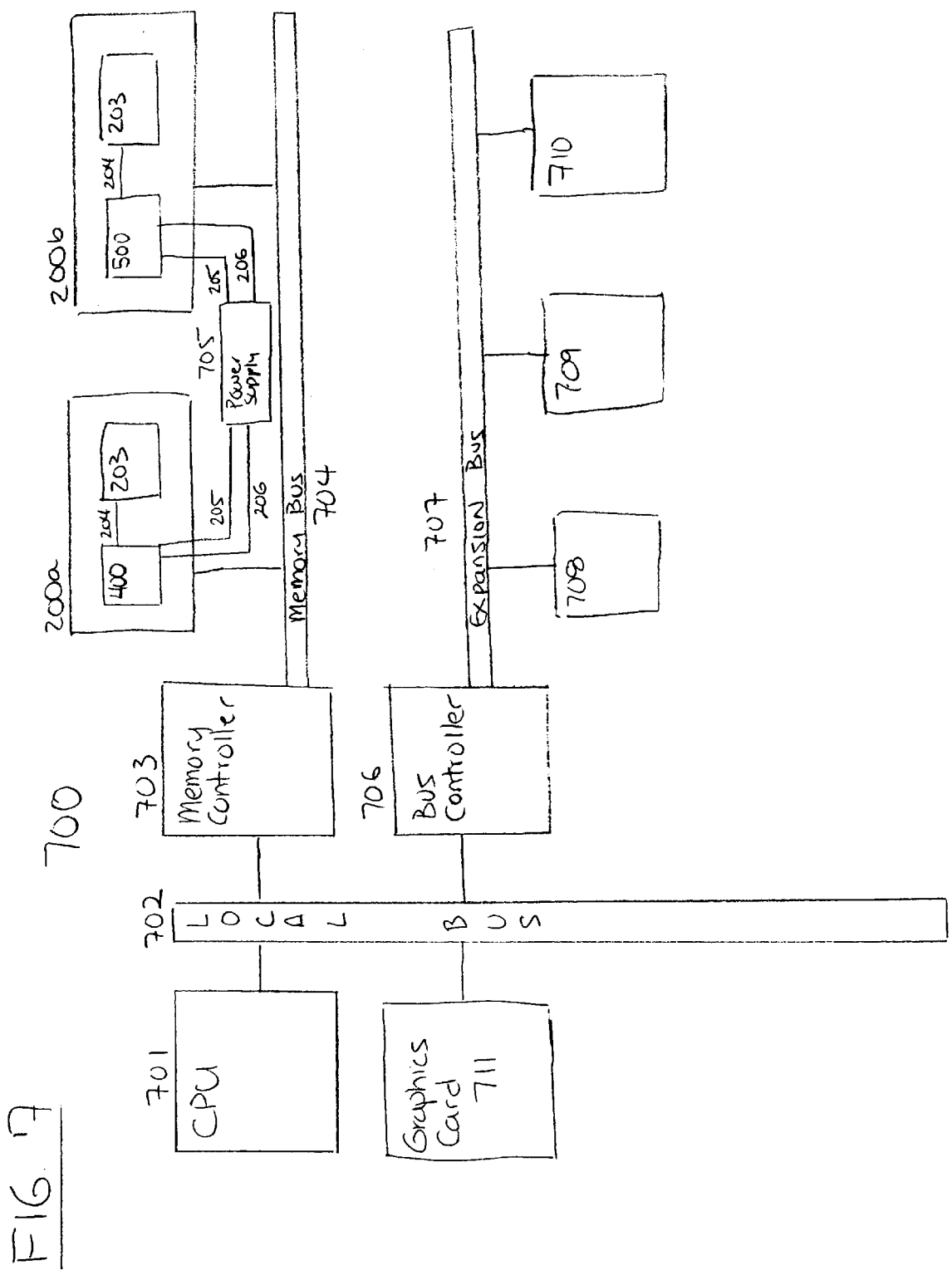

PUMP CIRCUITS USING FLYBACK EFFECT FROM INTEGRATED INDUCTANCE

FIELD OF THE INVENTION

The present invention relates to generating a larger magnitude output voltage from an input voltage, and more particularly, to on-chip charge pumps.

BACKGROUND OF THE INVENTION

Many electronic devices require a plurality of operating voltages. However, the power supply which furnishes power to electronic devices often only have a rather limited number of different output voltages. Thus, many electronic devices include power conversion circuitry to ensure the availability of the required voltages.

In many instances, the magnitude of an input power signal must be converted to a power signal having a voltage with a higher magnitude. Devices which perform this type of power conversion are known as charge pumps. For example, if a charge pump is provided with a positive input voltage, it may generate an output voltage which is more positive than the input voltage. Alternatively, if a charge pump is provided with a negative input voltage, it may generate an output voltage which is more negative than the input voltage.

One example of an electronic device which requires a charge pump is a dynamic random access memory (DRAM) device. DRAM devices typically include a large plurality (e.g., millions) of DRAM cells arranged in one or more arrays. A typical DRAM cell 100 is illustrated in FIG. 1. The information stored in a DRAM cell 100 is written to or read from a capacitor 102. The capacitor 102 is coupled to a potential source 105 and a source 101s of a transistor 101. The transistor 101 is used to control access to the capacitor, and is itself coupled to a word line 104 via gate 101g, as well as bit line 103 via drain 101d. The DRAM cell 100 is said to store a logical 0 if the amount of charge stored within the capacitor is such that node 102a is at a potential less than a reference potential, for example, ground potential. If the amount of charge stored in the capacitor 102 is such that the potential at node 102a is greater than the reference potential, the DRAM cell 100 is said to store a logical 1, for example Vcc potential. The reference potential corresponds to the potential of a reference capacitor (not shown) having an equilibrated charge, and typically corresponds to ½ Vcc. Typical values for Vcc include 5.0 volts and 3.3 volts. However, there is a trend towards using smaller voltages for Vcc, since reducing the magnitude of Vcc is advantageous for reducing power consumption, thereby permitting higher density and/or higher speed DRAM devices. DRAM devices are ordinarily coupled to power line(s) having a potential of Vcc. Many portions of a DRAM device require a voltage Vpp which is greater than Vcc. The DRAM device must therefore use a charge pump to create the higher Vpp and Vccp potentials from Vcc.

FIG. 2 is an illustration of a semiconductor device 200 which includes an integrated charge pump 202. The charge pump 202 and the operational circuit 203 are coupled to a ground potential GND via ground signal line 206 and to Vcc via signal line 205. The operational circuit 203 may include a variety of circuits. If the semiconductor device 200 is a DRAM, then the operational circuit would include portions of the DRAM circuitry. The semiconductor device 200 may alternatively be any number of other devices which may require the use of a charge pump 202 to generate a higher potential from base potential.

FIG. 3 is an illustration of a simple prior art pump circuit 300. The pump circuit 300 comprises an oscillator 301 which produces a square wave (or pulse train) which swings between ground potential and Vcc. An inverter 302 may be used to condition the square wave. The oscillator 301 produces a signal having a potential Vcc during a first phase. After the signal passes through inverter 302, it arrives at node 303 having ground potential. Meanwhile, transistor 306, which has a drain coupled to a power source having a potential of Vcc, is conducting, while transistor 307 is non-conducting. Thus, node 305 has a potential somewhat lower than Vcc and charge from the power source Vcc is being stored into capacitor 304. As charge is stored in capacitor 304, the potential at node 305 increases.

During the second phase of the oscillator 301, the oscillator 301 produces a signal at ground potential, which is transformed by the inverter 302 into a signal having a potential of Vcc. This further charges capacitor 304 and further raises the voltage at node 305. As the potential at node 305 builds, transistor 306 becomes non-conducting while transistor 307 becomes conducting. This causes the charge stored in capacitor 304 to be shared with the loading capacitor 308, thereby raising the voltage at the output terminal 309. During subsequent clock cycles, the charge stored in capacitor 304 during the first phase of the oscillator is transferred to the loading capacitor 308 during the second phase, resulting in a elevated voltage Vccp at the output terminal 309.

The prior art pump circuit 300 is dependent upon the capacitor 304 to generate the boosted voltage Vccp. This limits the operating frequency of the prior art pump circuit to the rate at which the capacitor 304 can be charged and discharged. As semiconductor devices such as DRAMs increase in frequency, it becomes increasingly difficult to charge and discharge the capacitor 304 at a corresponding higher rate. Thus, the prior art pump circuit 300 is unsuitable for use in high speed memory devices. Accordingly, there is a need for an apparatus and a method for a charge pump which is suitable for operation in high speed and/or low powered semiconductor devices.

SUMMARY OF THE INVENTION

The present invention is directed at an on-chip charge pump capable of supplying the boosted voltage required in a high speed semiconductor device such as a high speed dynamic random access memory (DRAM). The charge pump of the present invention is powered by the flyback effect of an inductor. The use of an inductor's flyback effect for the purpose of generating a boosted voltage is known. For example, the flyback effect is routinely used to generate the 10 kV high anode voltage in televisions and other cathode ray tube devices. However, semiconductor devices have traditionally used capacitor based charge pumps. In the present invention, a flyback based charge pump and its associated inductor are integrated into the semiconductor device. In the high speed semiconductor device, such as a DRAM, an inductor based charge pump may be operated at higher frequency than a traditional capacitor based charge pump.

BRIEF DESCRIPTION OF THE DRAWINGS

The forgoing and other advantages and features of the invention will be more clearly understood from the following detailed description of the invention which is provided in connection with the accompanying drawings.

FIG. 7 is an illustration of a computer system employing semiconductor devices according to the present invention.

DETAILED DESCRIPTION OF THE PREFERRED EMBODIMENTS

Figure 1:
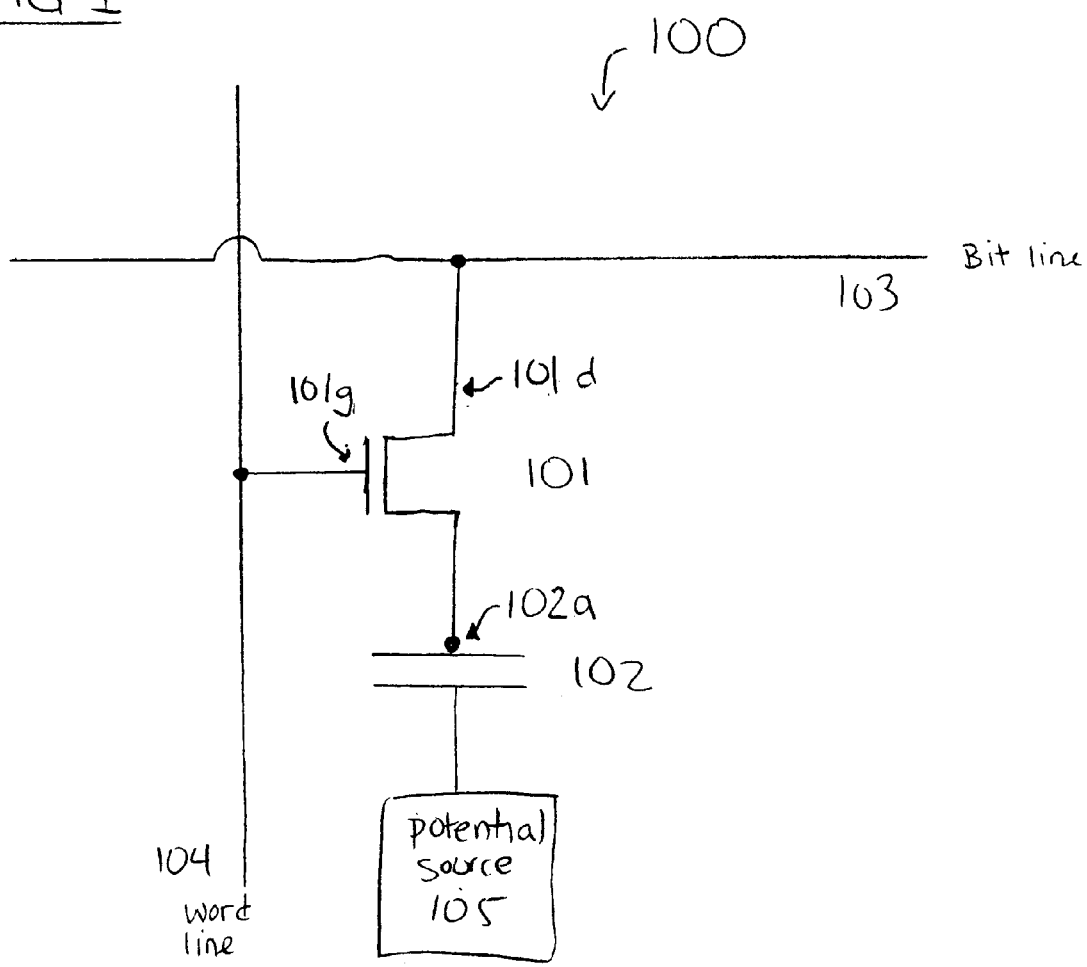
FIG. 1 is an illustration of a typical DRAM cell.
Figure 2:
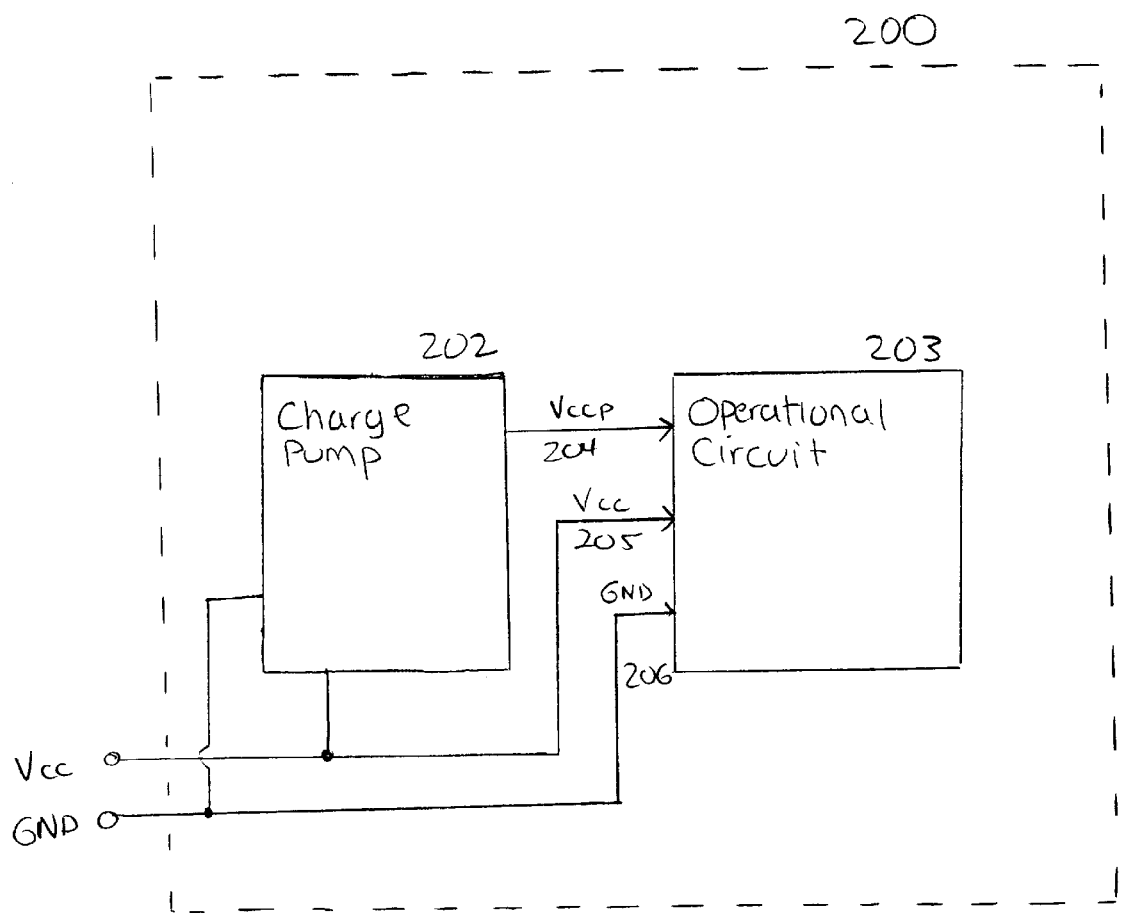
FIG. 2 is an illustration of a semiconductor device containing a charge pump and an operational circuit.
Figure 3:
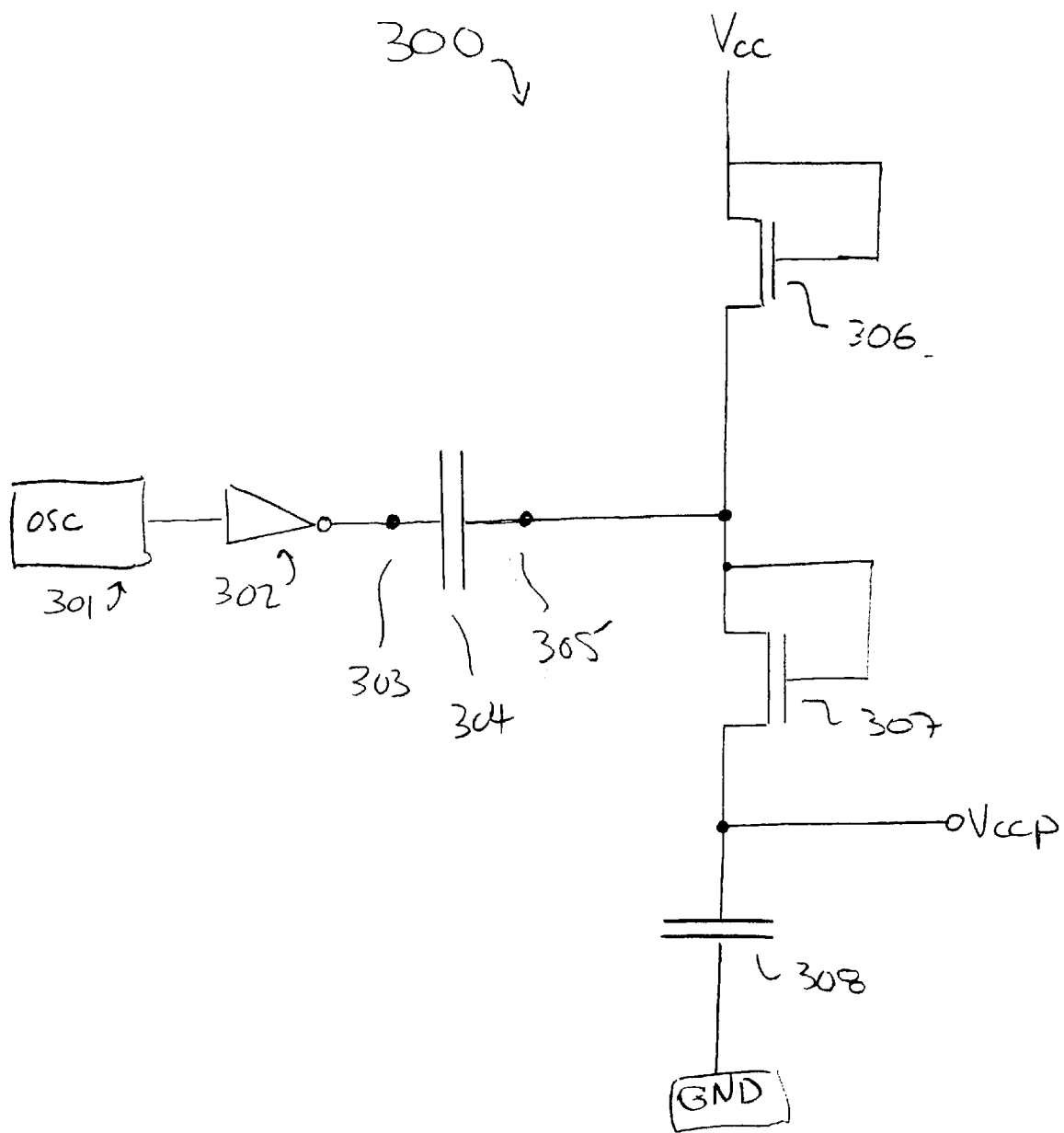
FIG. 3 is an illustration of a prior art pump circuit.
Figure 4:
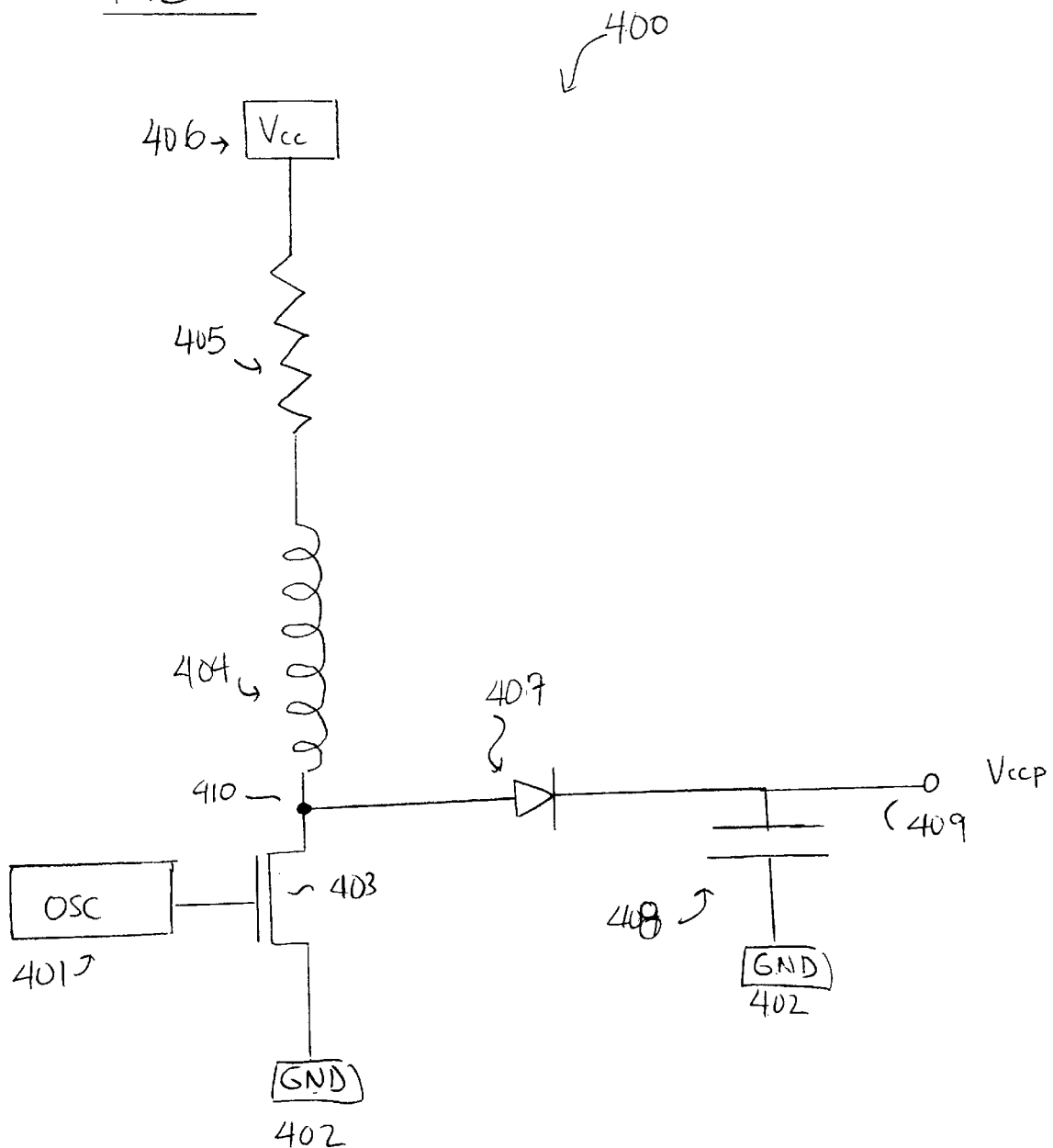
FIG. 4 is a circuit diagram of a single phase embodiment of the pump circuit of the present invention.

Now referring to the drawings, where like reference numerals designate like elements, there is shown in FIG. 4 a circuit diagram of a pump circuit 400 according to one embodiment of the present invention. The pump circuit 400 includes a source of input power (Vcc) 406, which is coupled to a resistor 405. The resistor is coupled to an inductor 404. (If the inductor 404 has sufficient internal resistance the resistor 405 may be omitted, in which case the input power source 406 would be directly coupled to the inductor 404.) The inductor 404 is coupled to the drain of a transistor 403 at node 410. The transistor 403 is also coupled to an oscillator 401 via its gate and to a ground potential 402 via its source. Node 410 is also coupled to a diode 407, which is also coupled to a holding capacitor 408 and a output node 409.

The oscillator 410 generates a square wave or pulse train which cyclically switches the transistor 403 on and off. When the transistor 403 is switched on, current from the voltage source 406 flows to the ground potential 402 via resistor 405, inductor 404, and transistor 403. Energy is stored in the inductor 404 in the form of an electric field. When the transistor 403 is switched off, the voltage at the inductor 404, and therefore also at node 410, increases as the inductor 404 dissipates the stored energy in an attempt to maintain the current flow. This is known as the flyback effect. The increased voltage causes additional charge to be stored in the holding capacitor 408, thereby presenting a boosted voltage Vccp at the output terminal 409. Eventually, the electric field within the inductor 404 collapses and the voltage at node 410 drops. The diode 407 prevents current from flowing from the holding capacitor 408 to node 410, thereby maintaining the boosted voltage Vccp at the output node 409.

The pump circuit 400 is suitable for use in a high speed semiconductor device. For example, in one embodiment, the pump circuit 400 is integrated into a high speed semiconductor memory device, for example, dynamic random access memory (DRAM), synchronous dynamic random access memory (SDRAM), or advance DRAM technology (ADT) devices. In one embodiment, the input power source may have a potential of approximately 1.8 volts and be capable of supplying a current of 95 mA. If the inductor has an inductance of 18 nH, the pump circuit 400 would be capable of outputting a boosted voltage Vccp of 2.8 volts while being switched at a frequency of 1 GHz (with transistor 403 having a fall time of 0.5 ns).

Figure 5:
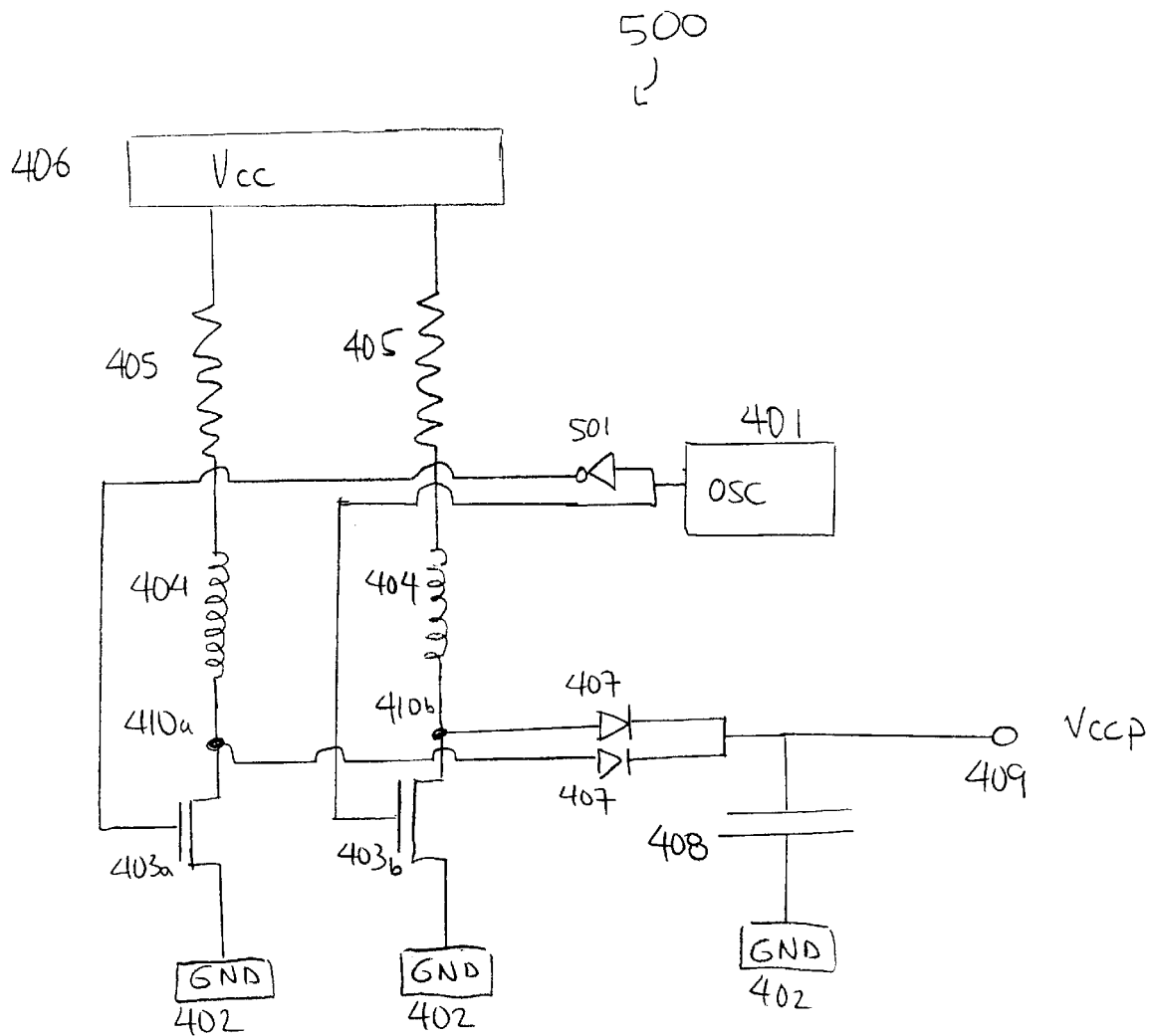
FIG. 5 is a circuit diagram of a dual phase embodiment of the pump circuit of the present invention.

The pump circuit 400 is a single phase pump because the pump only produces a boosted voltage on the falling edge of the pulse train generated by the oscillator 401. FIG. 5 is a circuit diagram of a dual phase pump 500, which generates the boosted voltage on both the rising and the falling edges of the pulse train. The dual phase pump 500 is essentially two of the single phase pump circuits 400 wired to run in parallel. Significantly, an inverter 501 is in the circuit path between the oscillator 401 and only one of the two transistors. The addition of the inverter causes the two transistors 403a, 403b to operate out of phase. Whenever one transistor 403a, 403b is conducting the other transistor 403b, 403a is non-conducting. This results in the dual phase pump circuit 500 producing a boosted voltage on both the rising and the falling transitions of the pulse train generated by oscillator 401.

Figure 6:
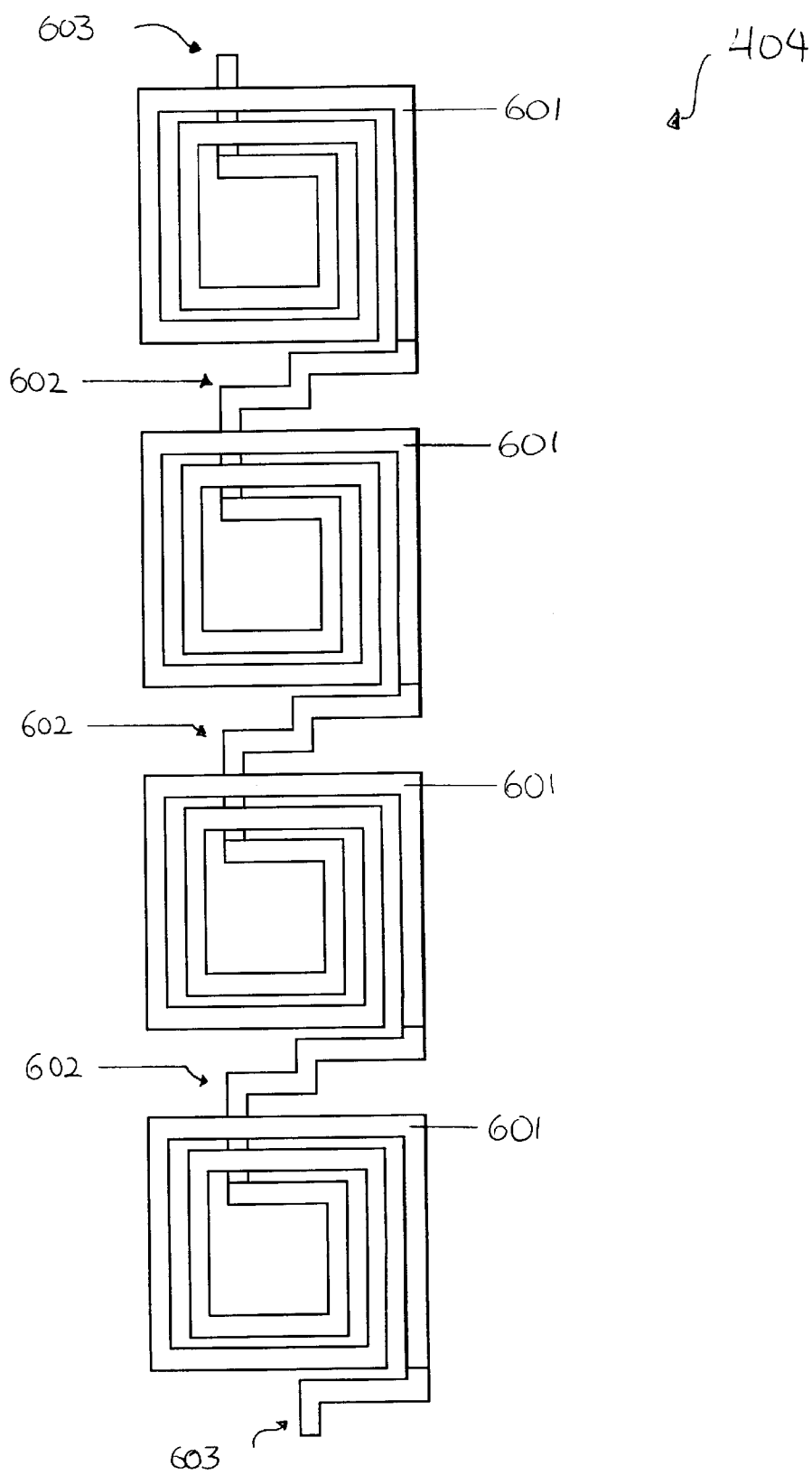
FIG. 6 is a illustration of an inductor in accordance with the present invention.

The inductor 404 is an essential element of the charge pumps 400, 500 of the present invention. One feature of the inductor 404 is that it is integrated into the semiconductor device. FIG. 6 is a more detailed illustration of the inductor 404. As FIG. 6 illustrates, the inductor 404 is comprised of a plurality of series connected metal spirals 601. Each of the metal spirals 601 may be formed, for example, at adjacent locations in the same metal layer. A plurality of connectors 602 may be used to serially connect the plurality of metal spirals 601. Portions of connectors 602 may be formed in different metalization layers and the portions connected with a conductive via. A pair of connectors 603 which is used to interface the inductor 404 to other components upon the semiconductor device. Portions of connectors 603 may likewise be formed in different metalization layers, with the portions being interconnected with conductive vias.

The inductance of the inductor 404 may be changed by varying the characteristics of each metal spiral 601. For example, the inductance of each metal spiral 602 may be changed by varying the width of the metal, the distance between each spiral, or the number of spirals. Similarly, the inductance of the inductor 404 may also be changed by varying the number of serially connected spirals.

Semiconductor devices which employ the charge pumps 400, 500 of the present invention are suitable for use in numerous electronic systems. For example, FIG. 7 is an illustration of how semiconductor memory devices employing charge pumps 400, 500 of the p resent invention may be used in a computer system. The computer system 700 includes a central processing unit 701 which is coupled to a local bus 702. High speed peripherals, such as a graphics card 711, a memory controller 703 and an expansion bus controller 706 are also coupled to the local bus 702. The memory controller 703 is also coupled to a memory bus 704. The memory bus 704 may include memory devices 200a, 200b which incorporate the charge pumps 400, 500 of the present invention. In FIG. 7, memory device 200a include s a single phase charge pump 400 while memory device 200b includes a double phase charge pump 500. The charge pumps 400, 500 are coupled to a power supply 705 via lines 205, 206 and provide a boosted voltage to the operational circuit 203 of the memory device 200a, 200b via line 204. The expansion bus controller 706 is also coupled to a expansion bus 707, to which various peripherals 708, 709, 710 may be attached. Examples of peripherals include, but are not limited to keyboards, mice, disk controllers, scanners, etc.

While certain embodiments of the invention have been described and illustrated above, the invention is not limited to these specific embodiments as numerous modifications, changes and substitutions of equivalent elements can be made without departing from the spirit and scope of the invention. Examples of some of the modification which may be made include varying the duty cycle of the oscillator 401 may promote efficiency (a reduction in the duty cycle may promote efficiency), changing the ratings of the various components of the charge pump in order to vary the output voltage of the charge pump (which could be made to have a lesser magnitude than the input voltage), and using either a greater number or a less number (including a single) spiral when constructing the inductor. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A semiconductor device, comprising:
   a substrate;
   a charge pump disposed on said substrate, said charge pump further comprising,
      a first inductor coupled to an input power having a first voltage;
      a first transistor coupled to said first inductor via a drain of said first transistor;
      an oscillator coupled to said transistor via a gate of said first transistor; and
      a ground potential coupled to said transistor via a source of said first transistor,
      a second inductor coupled to the input power; and
      a second transistor, wherein said second transistor is, coupled to said second inductor via a drain of said second transistor, coupled to the oscillator, with inverted phase, via a gate of said second transistor, and coupled to the ground potential, via a source of said second transistor; wherein
         said charge pump outputs an output power having a second voltage generated using said first and second inductors, said second voltage being different in magnitude than said first voltage; and
   an operational circuit disposed on said substrate, wherein said operational circuit is coupled to an output of said charge pump.

2. The semiconductor device of claim 1, wherein said second inductor is disposed in a conductive layer provided over said substrate.

3. The semiconductor device of claim 1,
   wherein said inductor further comprises,
      a first plurality of metal spirals disposed in said conductive layer over substrate, each of said first plurality of metal spirals having an outside end and an inside end; and
      a second plurality of conductive connectors, wherein said second plurality of conductive connectors serially connect the first plurality of metal spirals by coupling the outside end of a previous metal spiral to the inside end of a subsequent metal spiral; and
   wherein said second inductor further comprises,
      a third plurality of metal spirals disposed in said conductive layer over substrate, each of said third plurality of metal spirals having an outside end and an inside end; and
      a fourth plurality of conductive connectors, wherein said fourth plurality of conductive connectors serially connect the third plurality of metal spirals by coupling the outside end of a previous metal spiral to the inside end of a subsequent metal spiral.

4. The semiconductor device of claim 1, wherein said operational circuit is a memory circuit.

5. The semiconductor device of claim 4, wherein said memory circuit is a dynamic random access memory circuit.

6. The semiconductor device of claim 4, wherein said memory circuit is a synchronous dynamic random access memory circuit.

7. The semiconductor device of claim 1, wherein said inductor comprises one metal spiral and said second inductor comprises one metal spiral.

8. A computer system, comprising:
   a bus;
   a central processing unit coupled to said bus;
   a semiconductor memory device coupled to said bus, wherein said semiconductor memory device further comprises:
      a substrate;
      a charge pump disposed on said substrate, said charge pump further comprising,
         a first inductor coupled to an input power having a first voltage;
         a first transistor coupled to said first inductor via a drain of said first transistor;
         an oscillator coupled to said transistor via a gate of said first transistor; and
         a ground potential coupled to said transistor via a source of said first transistor,
         a second inductor coupled to the input power; and
         a second transistor, wherein said second transistor is, coupled to said second inductor via a drain of said second transistor, coupled to the oscillator, with inverted phase, via a gate of said second transistor, and coupled to the ground potential, via a source of said second transistor; wherein
            said charge pump outputs an output power having a second voltage generated using said first and second inductors, said second voltage being different in magnitude than said first voltage; and
      an operational circuit disposed on said substrate, wherein said operational circuit is coupled to an output of said the charge pump.

9. The computer system of claim 8, wherein said second inductor is disposed in a conductive layer provided over said substrate.

10. The computer system of claim 8,
    wherein said inductor further comprises,
       a first plurality of metal spirals disposed in said conductive layer over said substrate, each of said first plurality of metal spirals having an outside end and an inside end; and
       a second plurality of conductive connectors, wherein said second plurality of conductive connectors serially connect the first plurality of metal spirals by coupling the outside end of a previous metal spiral to the inside end of a subsequent metal spiral; and
    wherein said second inductor further comprises,
       a third plurality of metal spirals disposed in said conductive layer over said substrate, each of said third plurality of metal spirals having an outside end and an inside end; and
       a fourth plurality of conductive connectors, wherein said fourth plurality of conductive connectors serially connect the third plurality of metal spirals by coupling the outside end of a previous metal spiral to the inside end of a subsequent metal spiral.

11. The computer system of claim 8, wherein said inductor comprise one metal spiral and second inductor comprise one spiral metal choice.

12. A method for generating an output signal having a higher magnitude voltage than an input signal for use on a semiconductor device, said method comprising the steps of:
    receiving a first voltage at a charge pump fabricated on a substrate of a semiconductor device;

generating, by the charge pump, an output voltage which is different in magnitude than said first voltage, said charge pump generating said output power using a first inductor coupled to a first transistor and an input power source; and a second inductor coupled to a second transistor and the input power source; and operating a gate of the second transistor at an inverted phase with respect to said a gate of said first transistor.

13. The method of claim 12, wherein said first inductor comprises:
a first plurality of metal spirals disposed in said conductive layer over substrate, each of said first plurality of metal spirals having an outside end and an inside end; and
a second plurality of conductive connectors, wherein said second plurality of conductive connectors serially connect the first plurality of metal spirals by coupling the outside end of a previous metal spiral to the inside end of a subsequent metal spiral.

14. The method of claim 12, wherein said second inductor comprises:
a third plurality of metal spirals disposed in said conductive layer over said substrate, each of said third plurality of metal spirals having an outside end and an inside end; and
a fourth plurality of conductive connectors, wherein said fourth plurality of conductive connectors serially connect the third plurality of metal spirals by coupling the outside end of a previous metal spiral to the inside end of a subsequent metal spiral.

15. The method of claim 12, wherein said first inductor comprises one metal spiral.

16. The method of claim 12, wherein said second inductor comprises one metal spiral.

17. A semiconductor device, comprising:
a substrate;
a charge pump disposed on said substrate, said charge pump further comprises,
a first inductor coupled to an input power having a first voltage;
a first transistor coupled to said first inductor via a drain of said first transistor;
an oscillator coupled to said transistor via a gate of said first transistor; and
a ground potential coupled to said transistor via a source of said first transistor,
a second inductor coupled to the input power; and
a second transistor, wherein said second transistor is, coupled to said second inductor via a drain of said second transistor, coupled to the oscillator, with delayed phase, via a gate of said second transistor, and coupled to the ground potential, via a source of said second transistor; wherein
said charge pump outputs an output power having a second voltage generated using said first and second inductors, said second voltage being different in magnitude than said first voltage; and
an operational circuit disposed on said substrate, wherein said operational circuit is coupled to an output of said charge pump.

18. A semiconductor device, comprising:
a substrate;
a charge pump disposed on said substrate, said charge pump further comprises,
a first inductor coupled to an input power having a first voltage;
a first transistor coupled to said first inductor via a drain of said first transistor;
an oscillator coupled to said transistor via a gate of said first transistor; and
a ground potential coupled to said transistor via a source of said first transistor,
a plurality of additional inductors, each coupled to the input power; and
a plurality of additional transistors, wherein each of said additional transistors are, coupled to a corresponding one of said additional inductors via a drain of said additional transistor, coupled to the oscillator, with different phase, via a gate of said additional transistor, and coupled to the ground potential, via a source of said additional transistor; wherein
said charge pump outputs an output power having a second voltage generated using said first and additional inductors, said second voltage being different in magnitude than said first voltage; and
an operational circuit disposed on said substrate, wherein said operational circuit is coupled to an output of said charge pump.

19. A computer system, comprising:
a bus;
a central processing unit coupled to said bus;
a semiconductor memory device coupled to said bus, wherein said semiconductor memory device further comprises:
a substrate;
a charge pump disposed on said substrate, said charge pump further comprising,
a first inductor coupled to an input power having a first voltage;
a first transistor coupled to said first inductor via a drain of said first transistor;
an oscillator coupled to said transistor via a gate of said first transistor; and
a ground potential coupled to said transistor via a source of said first transistor,
a second inductor coupled to the input power; and
a second transistor, wherein said second transistor is, coupled to said second inductor via a drain of said second transistor, coupled to the oscillator, with delayed phase, via a gate of said second transistor, and coupled to the ground potential, via a source of said second transistor; wherein
said charge pump outputs an output power having a second voltage generated using said first and second inductors, said second voltage being different in magnitude than said first voltage; and
an operational circuit disposed on said substrate, wherein said operational circuit is coupled to an output of said the charge pump.

20. A computer system, comprising:
a bus;
a central processing unit coupled to said bus;
a semiconductor memory device coupled to said bus, wherein said semiconductor memory device further comprises:
a substrate;
a charge pump disposed on said substrate, said charge pump further comprising,
a first inductor coupled to an input power having a first voltage;
a first transistor coupled to said first inductor via a drain of said first transistor;

an oscillator coupled to said transistor via a gate of said first transistor; and a ground potential coupled to said transistor via a source of said first transistor, a plurality of additional inductors, each coupled to the input power; and a plurality of additional transistors, wherein each additional transistor is coupled to a corresponding one of said additional inductors via a drain of said second transistor, coupled to the oscillator, with different phase, via a gate of said second transistor, and coupled to the ground potential, via a source of said second transistor; wherein said charge pump outputs an output power having a second voltage generated using said first and additional inductors, said second voltage being different in magnitude than said first voltage; and an operational circuit disposed on said substrate, wherein said operational circuit is coupled to an output of said the charge pump.

* * * * *